United States Patent
Teng et al.

(10) Patent No.: US 6,793,785 B2
(45) Date of Patent: Sep. 21, 2004

(54) MAGNETIC CONTROL OSCILLATING-SCANNING SPUTTER

(75) Inventors: Tun-Ho Teng, Taoyuan Hsien (TW); Cheng-Chung Lee, Ping Chen (TW)

(73) Assignee: HannStar Display Corp., Tao-Yuan (TW)

( * ) Notice: Subject to any disclaimer, the term of this patent is extended or adjusted under 35 U.S.C. 154(b) by 40 days.

(21) Appl. No.: 10/277,826

(22) Filed: Oct. 23, 2002

(65) Prior Publication Data

US 2003/0230482 A1 Dec. 18, 2003

(30) Foreign Application Priority Data

Jun. 18, 2002 (TW) .......................................... 91113306

(51) Int. Cl.$^7$ ............................................. C23C 14/35
(52) U.S. Cl. ................. 204/298.2; 204/298.22
(58) Field of Search ...................... 204/298.16, 298.17, 204/298.18, 298.19, 298.2, 298.21, 298.22

(56) References Cited

U.S. PATENT DOCUMENTS

| | | | |
|---|---|---|---|
| 5,328,585 A | * | 7/1994 | Stevenson et al. ........ 204/298.2 |
| 5,364,518 A | * | 11/1994 | Hartig et al. .......... 204/298.22 |
| 6,375,814 B1 | * | 4/2002 | De Bosscher et al. .. 204/298.21 |

* cited by examiner

*Primary Examiner*—Rodney G. McDonald
(74) *Attorney, Agent, or Firm*—Troxell Law Office PLLC

(57) ABSTRACT

A magnetic control oscillation-scanning sputter includes a sputtering target, a base and an elongated magnet. The sputtering target has a surface with a target located thereon corresponding to the base. The target being sputtered is deposited on the base. The elongated magnet is located on the rear side of the sputtering target and moved reciprocately to control the deposition of the target. The elongated magnet has two ends each which is coupled with a magnetic erasing means for reducing excessive magnetic field intensity at the two ends to avoid affecting the sputter quality.

19 Claims, 5 Drawing Sheets

*Rs Distribution chart*

Unit : Ohm / Area

| | | |
|---|---|---|
| 0.4743 | 0.4883 | 0.4838 |
| | 0.5341 | 0.5370 | |
| 0.5048 | 0.5647 | 0.5074 |
| | 0.5395 | 0.5355 | |
| 0.5180 | 0.5216 | 0.4945 |

| | Rs |
|---|---|
| Avg | 0.5159 |
| σ | 0.02621 |

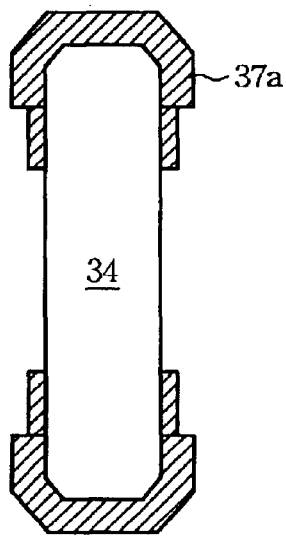
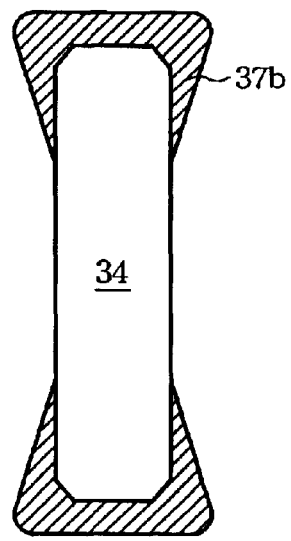
FIG.3B　　　　　　FIG.3C
*Rs Distribution chart*
Unit : Ohm / Area
| 0.5078 | 0.4851 | 0.5332 |
| --- | --- | --- |
| | 0.5189 | 0.5194 | |
| 0.5052 | 0.5287 | 0.5065 |
| | 0.5207 | 0.5173 | |
| 0.5404 | 0.5012 | 0.5160 |
| | Rs |
| --- | --- |
| Avg | 0.5154 |
| $\sigma$ | 0.01454 |
FIG.4

MAGNETIC CONTROL OSCILLATING-SCANNING SPUTTER

FIELD OF THE INVENTION

The present invention relates to a sputter and particularly a magnetic control oscillation-scanning sputter for improving magnetic field distribution.

BACKGROUND OF THE INVENTION

Sputtering is a semiconductor manufacturing process for depositing a metal film. The main principle of sputtering is to introduce plasma ions into the chamber of the sputter and accelerate the ion's speed to bombard a sputtering target, and then the target atoms on the surface of the sputtering target are blasted and scattered to deposit a metal film.

Referring to FIG. 1A for a conventional magnetic control oscillation-scanning sputter 10. The sputter 10 includes a chamber 11, a sputtering target 18, a base 13 and an elongated magnet 14. The sputtering target 18 includes a back plate 12 and a target 16. A substrate 15 is provided on the top of the base 13. The chamber 11 is vacuumized by a vacuum pump (not shown in the drawing). Charged plasma ions are introduced into the chamber, preferably, the charged plasma ions are argon ions with positive charges. The sputtering target 18 and the base 13 are connected respectively to a negative and a positive electrode to generate an electric potential gradient driving the positive argon ions to bombard the target 16 on the surface of the sputtering target 18. As a result, the atoms of the target 16 are deposited on a substrate 15 to form a film. The substrate 15 would be a wafer or a glass. The elongated magnet 14, as shown in FIG. 1B, is located on the rear side of the sputtering target 18. The elongated magnet 14 is moved and scanned reciprocately on the back side of the sputtering target 18 to control magnetic field strength to improve the uniformity and speed of film deposition on the surface of the substrate 15.

Referring to FIGS. 2A and 2B for the analysis of the deposited film on the substrate surface and the erosion condition on the target surface. The above-identified two figures indicate that conventional sputter still have following shortcomings:

1. non-uniformity of the film deposition: the testing result presents that the two end of the film is deposited on the substrate surface by a sputtering process which has a lower resistance Rs comparing to the resistance of the center portion. According to the equation, Resistance (Rs)=Resistance coefficient (e)/Film thickness, aforesaid phenomenon indicates that the thickness of two sides is greater than the thickness of center portion. The quality of the film is determined by the uniformity of resistance Rs or film thickness.

2. low utilization rate of the sputtering target: the sputtering target includes the back plate and the target. The front surface of the sputtering target possessing an uniform thickness before sputtering. After bombarding by plasma ions, the target is gradually eroded and consumed. When the erosion occurs uniformly, the sputtering target can achieve a higher utilization rate. However, according to conventional techniques, two sides of the sputtering target corresponding to two ends of the magnet is eroded. Once the erosion reaches the back plate of the sputtering target, the sputtering target becomes useless and must be discarded.

The disadvantages mentioned above are caused by stronger magnetic field intensity at two ends of the elongated magnet. As a result, a greater erosion rate occurs at the two sides of above target while bombarding. Therefore, the thickness of above deposited film at two sides is greater than the thickness of the film at the center portion, and results in uniform resistance distribution on the surface of the substrate.

Therefore, to overcome the problems set forth above to increase the utilization rate of the sputtering target, and to achieve uniform thickness and resistance distribution for the deposited film on the substrate surface has become a important pursued issue in semiconductor manufacturing field.

SUMMARY OF THE INVENTION

Therefore the primary object of the invention is to provide a magnetic control oscillation-scanning sputter to improve the distribution of the magnetic field intensity. An improved elongated magnet is provided to distribute the magnetic field intensity uniformly, thereby to increase the utilization rate of the sputtering target and achieve uniform thickness and resistance distribution for the deposited film on the substrate surface.

The sputter according to the invention includes a chamber which contains a sputtering target, a base and an elongated magnet. The chamber is vacuumized by a vacuum pump. Charged plasma ions (such as argon ions with positive charges) are introduced into the chamber. The sputtering target and the base are connected respectively to a negative and a positive electrode to form an electric potential gradient to drive the positive argon ions to bombard the target located on the surface of the sputtering target. As a result, the atoms of the target are deposited on a substrate which is located on the surface of the base to form a film. The substrate, preferably, is composed of a wafer or a glass. The elongated magnet is located on the rear side of the sputtering target and is moved and scanned reciprocately on the back side of the sputtering target to provide magnetic control to improve the uniformity and speed of film deposition.

The elongated magnet of the invention has magnetic erasing means located at two ends of the magnet to reduce the magnetic field intensity of the two ends so that the magnetic field intensity of the entire magnet is distributed uniformly. Therefore non-uniformity erosion of the sputtering target during sputtering process is prevented, and utilization rate of the sputtering target is increased, and more uniform distribution of the thickness and resistance of the deposited film are achieved to improve the sputter quality. The magnetic erasing means used in the invention is composed of magnetic materials such as iron, cobalt, or nickel. Furthermore, the surface of the magnetic erasing means, preferably, is plated with chrome for preventing rusting. The magnetic erasing means can be formed in a double-hook or a dog bone shape, and is tapered from two ends towards the center to distribute the magnetic field intensity uniformly through out the entire elongated magnet.

The foregoing, as well as additional objects, features and advantages of the invention will be more readily apparent from the following detailed description, which proceeds with reference to the accompanying drawings.

BRIEF DESCRIPTION OF THE DRAWINGS

FIGS. 3B and 3C are schematic views of the elongated magnet of the invention.

FIG. 4 is a schematic diagram of resistance analysis of the deposited film on the surface of a substrate formed by the invention.

DESCRIPTION OF THE PREFERRED EMBODIMENT

The invention aims at providing a magnetic control oscillation-scanning sputter for improving distribution of the magnetic field intensity of the elongated magnet thereby to increase the utilization rate of the sputtering target and achieve uniform thickness deposition and resistance distribution of the deposited film on the substrate. More details are described by referring to the embodiment as follows.

Figure 3A:
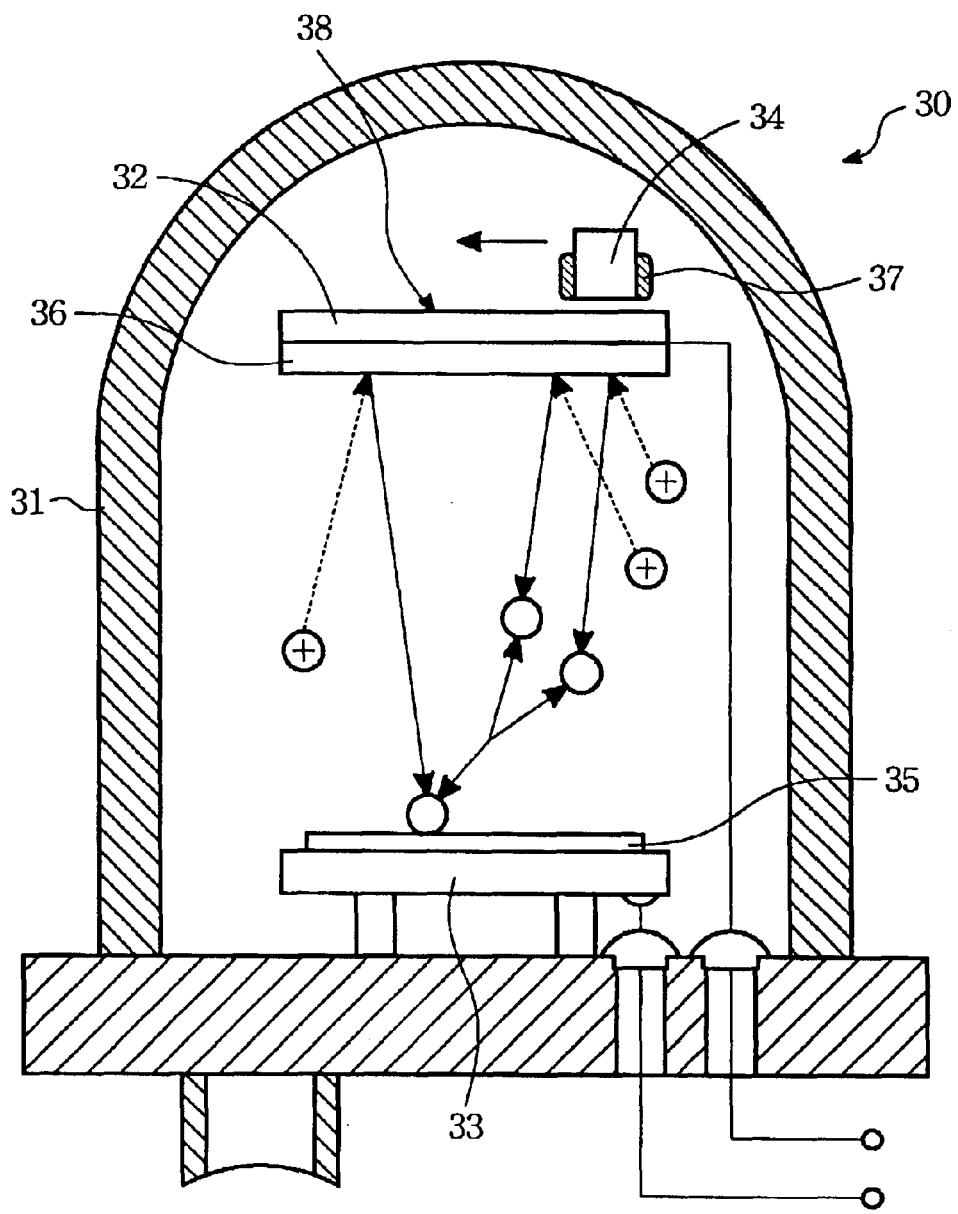
FIG. 3A is a schematic view of the magnetic control oscillation-scanning sputter of the invention.

Referring to FIG. 3A, the magnetic control oscillation-scanning sputter 30 of the invention comprises of a chamber 31, a sputtering target 38, a base 33 and an elongated magnet 34. The sputtering target 38 includes a back plate 32 and a target 36. The chamber 31 is vacuumized by a vacuum pump (not shown in the drawing). The sputtering target 38, base 33 and the elongated magnet 34 are located in the chamber 31. During the sputtering process, charged plasma ions (such as argon ions with positive charges, preferably with a concentration greater than 95%) are introduced into the chamber 31. The sputtering target 38 and the base 33 are connected respectively to a negative and a positive electrode to generate an electric potential gradient to drive the positive argon ions to bombard the target 36 which is located on the surface of the sputtering target 38.

When the target 36 is bombarded, the atoms of the target 36 will be blasted to deposit on the base 33. Thus a substrate 35 must be mounted on the base 33 for depositing atoms from the sputtering target 38. The elongated magnet 34 is located on the rear side of the sputtering target 38 and is moved and scanned reciprocately on the back side of the sputtering target 38 to control magnetic field strength to improve the uniformity and speed of the film deposition. As the magnetic field strength of the elongated magnet 34 decreases gradually from two ends to the center thereof, the magnetic field intensity distribution of the elongated magnet 34 also decreases gradually from the two ends to the center. This non-uniform distribution of the magnetic field intensity of the elongated magnet 34 is the main reason that causes low utilization rate of the sputtering target in conventional techniques and non-uniform distribution of the film thickness and resistance.

Referring to FIGS. 3B and 3C, in order to resolve the above disadvantages, a magnetic erasing means 37 is disposed at two ends of the elongated magnet 34 to reduce the magnetic field intensity at the two ends so that the magnetic field intensity of the entire elongated magnet 34 is distributed uniformly. Therefore the target 36 is prevented from eroding excessively on some portions and resulting in longer life time. In addition, the film is deposited on the substrate surface with an uniform thickness and resistance. The film quality is also improved. The magnetic erasing means 37 used in the invention is composed of magnetic material such as iron, cobalt, or nickel. The surface of the magnetic erasing means, preferably, is plated with chrome (Cr) for preventing rusting. The magnetic erasing means can be formed in a double-hook (as shown in FIG. 3B) or a dog bone (as shown in FIG. 3C) shape, and is tapered from two ends of the elongated magnet 34 towards the center to match the magnetic field intensity.

Figure 1A:
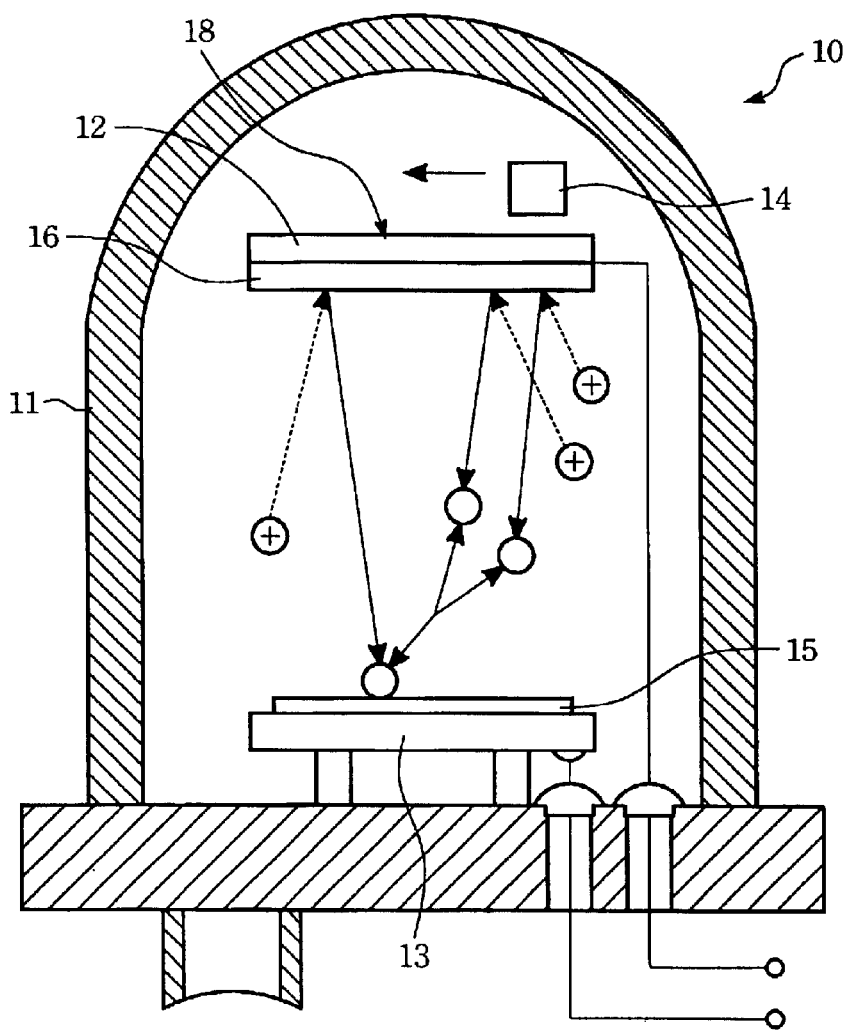
FIG. 1A is a schematic view of a conventional magnetic control oscillation-scanning sputter.
Figure 1B:
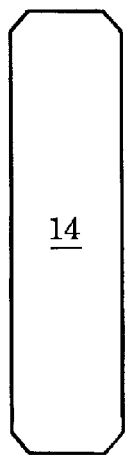
FIG. 1B is a schematic view of a conventional elongated magnet.
Figures 2A, 2B:
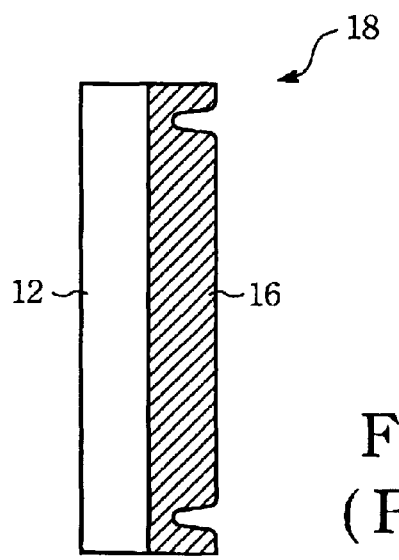
FIG. 2A is a schematic diagram of resistance analysis of the deposited film on the surface of a substrate formed by a conventional sputtering technique.
FIG. 2B is a schematic view of the surface erosion of a sputtering target after sputtering process according to a conventional technique.

FIG. 4 is a schematic diagram showing the resistance analysis of the deposited film on the surface of the substrate 33 by the invention. Comparing with FIG. 2A, under the same average resistance, the variations of resistance of the substrate 35 are smaller than that of the conventional techniques. It indicates that the resistance and the film thickness of the substrate 35 are distributed more uniformly, and a sputtering quality is improved.

Figure 5:
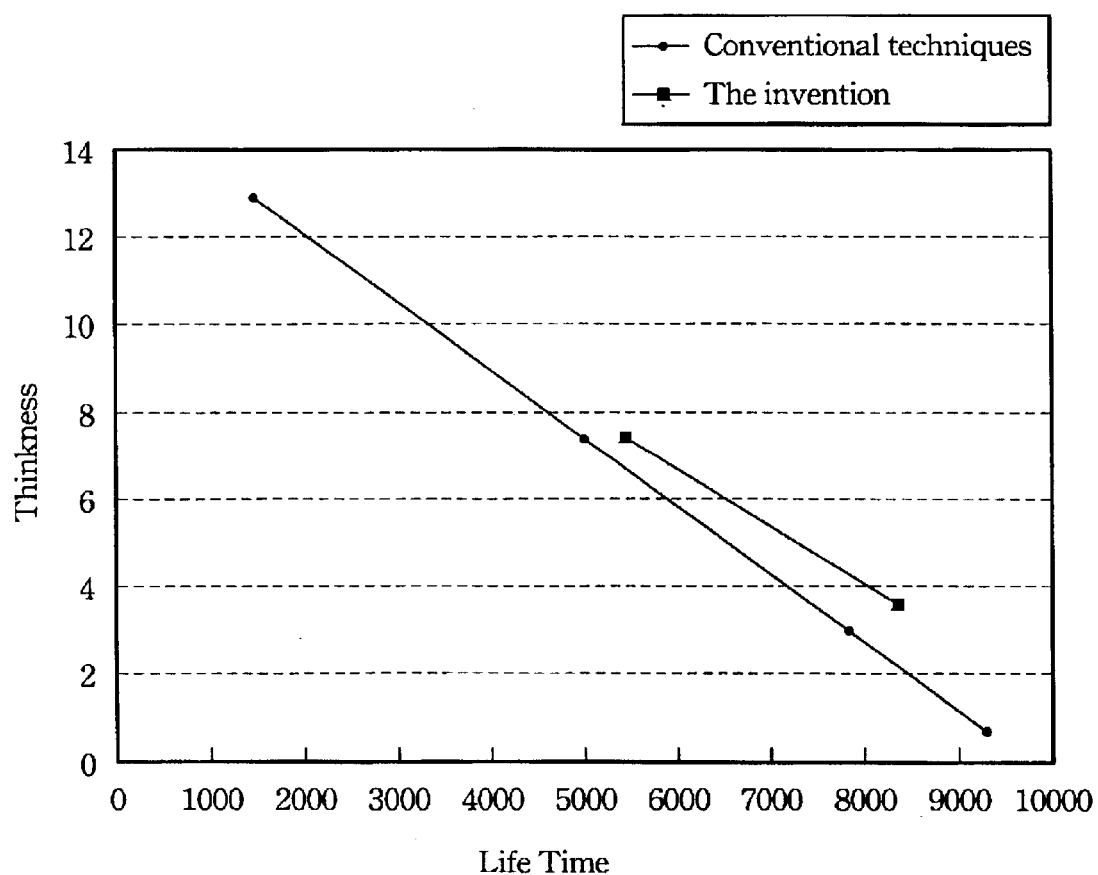
FIG. 5 is a chart showing the relationship between the residual thickness and utilization life time of the sputtering target of the invention and the conventional technique.

FIG. 5 is a chart showing the relationship between the residual thickness and utilization life time of the sputtering target of the invention and the conventional technique. As the invention provides more uniform distribution of magnetic field intensity for the elongated magnet 34, the sputtering target 38 is eroded and consumed more uniformly than that of the conventional techniques. Thus utilization rate of the sputtering target 38 is increased. As shown in the drawing, with the same residual thickness of the target 36, utilization life time of the sputtering target 38 is significantly greater than the conventional one. As a result, consumption of the sputtering target 38 and the cost of sputtering are reduced according to this invention.

While the preferred embodiment of the invention has been set forth for the purpose of disclosure, modifications of the disclosed embodiment of the invention as well as other embodiments thereof may occur to those skilled in the art. Accordingly, the appended claims are intended to cover all embodiments which do not depart from the spirit and scope of the invention.

What is claimed is:

1. A magnetic control oscillation sputter apparatus for use in a chamber comprising:
    a sputtering target having a front side with a target located thereon;
    a base corresponding to the sputtering target for depositing thereon;
    an elongated magnet located on a rear side of the sputtering target being moved reciprocately to control deposition of the target on the surface of the base; and
    a magnetic erasing means located at two ends of the elongated magnet for reducing the magnetic field intensity at the two ends thereof.

2. The magnetic control oscillation sputter apparatus of claim 1, wherein the chamber is vacuumized by a vacuum pump.

3. The magnetic control oscillation sputter apparatus of claim 1 further including plasma ions with positive charges being introduced during sputtering processes.

4. The magnetic control oscillation sputter apparatus of claim 3, wherein the plasma ions are argon ions with a concentration greater than 95%.

5. The magnetic control oscillation sputter apparatus of claim 1 further comprises a substrate mounted on the base for being deposited atoms from the sputtering target.

6. The magnetic control oscillation sputter apparatus of claim 5, wherein the substrate is a wafer or a glass.

7. The magnetic control oscillation sputter apparatus of claim 1, wherein the magnetic erasing means is made of a magnetic material selecting from the group consisting of iron, cobalt and nickel.

8. The magnetic control oscillation sputter apparatus of claim 7, wherein the magnetic erasing means is plated with chrome for preventing rusting.

9. The magnetic control oscillation sputter apparatus of claim 1, wherein the magnetic erasing means is formed to a double hook or a dog bone structure.

10. A magnetic control oscillation sputter apparatus comprising:
- a sputtering target having a front side with a target located thereon;
- a base corresponding to the sputtering target for depositing thereon; and
- an elongated magnet located on a rear side of the sputtering target being moved reciprocately to control deposition of the target on the surface of the base;
- wherein the elongated magnet has two ends each coupled with a magnetic erasing means for reducing the magnetic field intensity at the two ends thereof.

11. The magnetic control oscillation sputter apparatus of claim 10 further including a chamber.

12. The magnetic control oscillation sputter apparatus of claim 11, wherein the chamber is vacuumized by a vacuum pump.

13. The magnetic control oscillation sputter apparatus of claim 10 further including plasma ions with positive charges being introduced during sputtering processes.

14. The magnetic control oscillation sputter apparatus of claim 13, wherein the plasma ions are argon ions with a concentration greater than 95%.

15. The magnetic control oscillation sputter apparatus of claim 10 further comprises a substrate mounted on the base for having atoms deposited thereon from the sputtering target.

16. The magnetic control oscillation sputter apparatus of claim 15, wherein the substrate is a wafer or a glass.

17. The magnetic control oscillation sputter apparatus of claim 10, wherein the magnetic erasing means is made of a magnetic material selecting from the group consisting of iron, cobalt and nickel.

18. The magnetic control oscillation sputter apparatus of claim 17, wherein the magnetic erasing means is plated with chrome for preventing rusting.

19. The magnetic control oscillation sputter apparatus of claim 10, wherein the magnetic erasing means is formed to a double hook or a dog bone structure.

* * * * *